(12) United States Patent
Kalms et al.

(10) Patent No.: US 8,238,101 B2
(45) Date of Patent: Aug. 7, 2012

(54) HEAT TRANSFER SYSTEM FOR MEMORY MODULES

(75) Inventors: Sven Kalms, Munich (DE); Christian Weiss, Munich (DE)

(73) Assignee: Qimonda AG, Munich (DE)

( * ) Notice: Subject to any disclaimer, the term of this patent is extended or adjusted under 35 U.S.C. 154(b) by 170 days.

(21) Appl. No.: 12/201,524

(22) Filed: Aug. 29, 2008

(65) Prior Publication Data

US 2009/0080151 A1    Mar. 26, 2009

(30) Foreign Application Priority Data

Sep. 25, 2007  (DE) .......................... 10 2007 045 733

(51) Int. Cl.
*H05K 7/20*    (2006.01)
*F28F 7/00*    (2006.01)
*H01L 23/34*    (2006.01)
*H01R 13/62*    (2006.01)

(52) U.S. Cl. .................. 361/700; 361/679.52; 361/715; 361/719; 165/80.4; 165/80.5; 165/104.33; 257/715; 439/331; 439/70; 439/487; 439/325

(58) Field of Classification Search .............. 361/679.52, 361/679.53, 700, 715, 716, 719; 165/80.4, 165/80.5, 104.33, 185; 174/15.2; 257/714, 257/715; 439/330, 331, 70, 487, 327, 633, 439/325, 160; 292/DIG. 66
See application file for complete search history.

(56) References Cited

U.S. PATENT DOCUMENTS

| | | | | |
|---|---|---|---|---|
| 4,315,300 A | * | 2/1982 | Parmerlee et al. | 361/703 |
| 4,971,570 A | * | 11/1990 | Tolle et al. | 439/327 |
| 5,036,428 A | * | 7/1991 | Brownhill et al. | 361/721 |
| 6,055,157 A | * | 4/2000 | Bartilson | 361/699 |
| 6,278,609 B1 | * | 8/2001 | Suzuki et al. | 361/704 |
| 7,151,668 B1 | | 12/2006 | Stathakis | |
| 7,187,552 B1 | * | 3/2007 | Stewart et al. | 361/704 |
| 7,286,436 B2 | * | 10/2007 | Bhakta et al. | 365/230.02 |
| 7,345,877 B2 | * | 3/2008 | Asfia et al. | 361/700 |
| 7,480,147 B2 | * | 1/2009 | Hoss et al. | 361/721 |
| 7,639,498 B2 | * | 12/2009 | Campbell et al. | 361/699 |
| 2003/0010477 A1 | * | 1/2003 | Khrustalev et al. | 165/104.33 |
| 2006/0056154 A1 | * | 3/2006 | Foster et al. | 361/700 |
| 2006/0139891 A1 | * | 6/2006 | Gauche et al. | 361/719 |
| 2008/0251911 A1 | * | 10/2008 | Farnsworth et al. | 257/714 |
| 2008/0291630 A1 | | 11/2008 | Monh et al. | |
| 2009/0277616 A1 | * | 11/2009 | Cipolla et al. | 165/104.33 |
| 2010/0085712 A1 | * | 4/2010 | Hrehor et al. | 361/699 |

OTHER PUBLICATIONS

U.S. Appl. No. 60/940,155 entitled "Method and Apparatus for Cooling of Computer Memory Using Heatpipes", filed May 25, 2007.

* cited by examiner

*Primary Examiner* — Zachary M Pape

(74) *Attorney, Agent, or Firm* — Patterson & Sheridan, LLP

(57) ABSTRACT

The memory module comprises a circuit board with a first and a second side, wherein memory chips are arranged at least on the first side. A longitudinally extending module heat conductor is arranged on the first side. The module heat conductor comprises a contact surface configured to contact a heat transfer system.

20 Claims, 4 Drawing Sheets

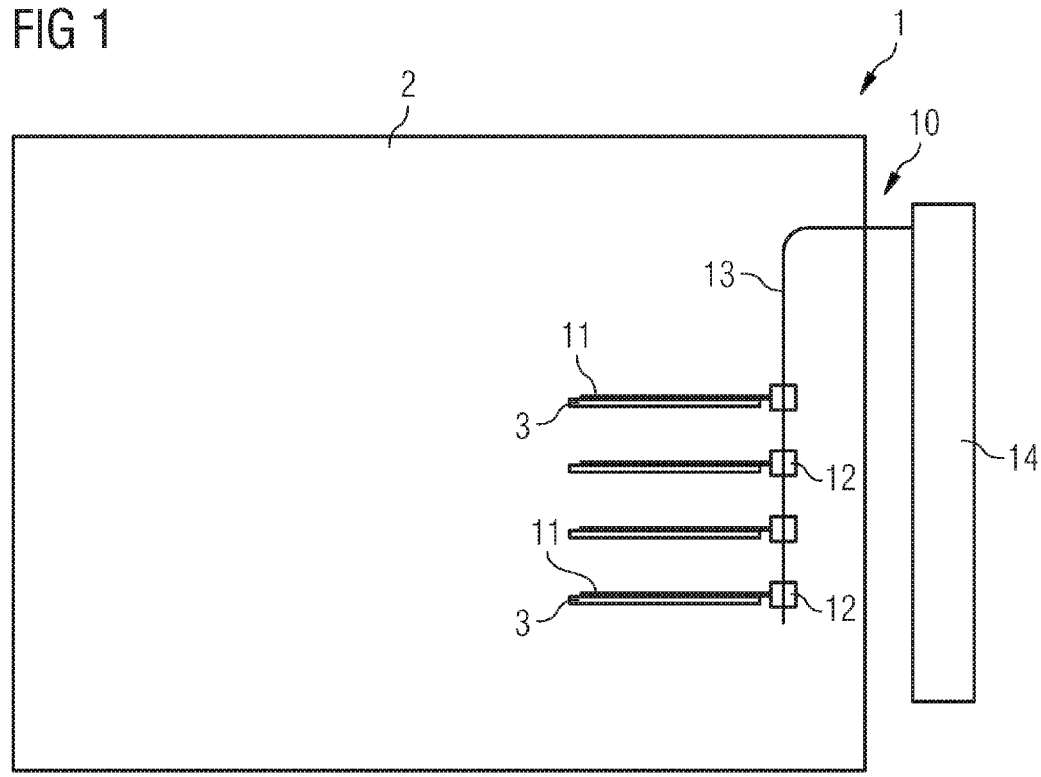
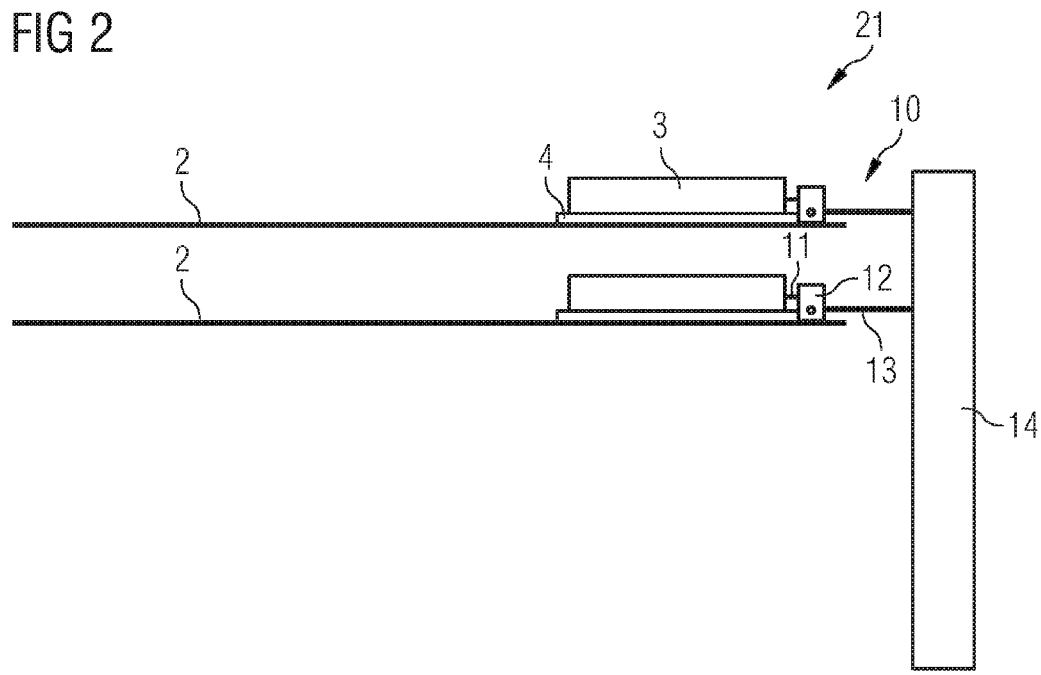

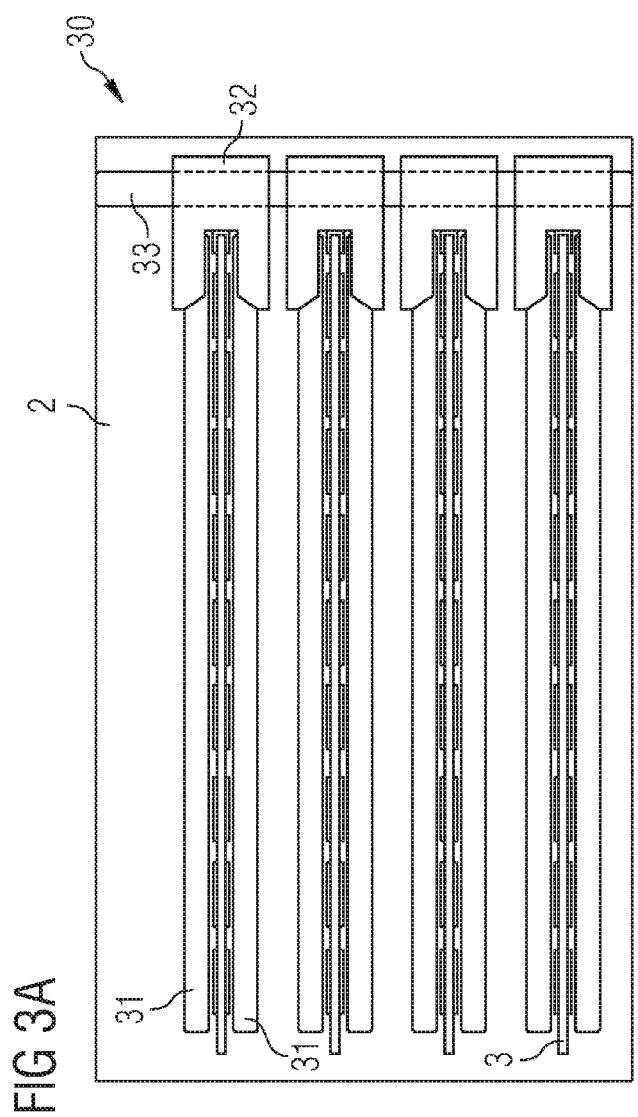
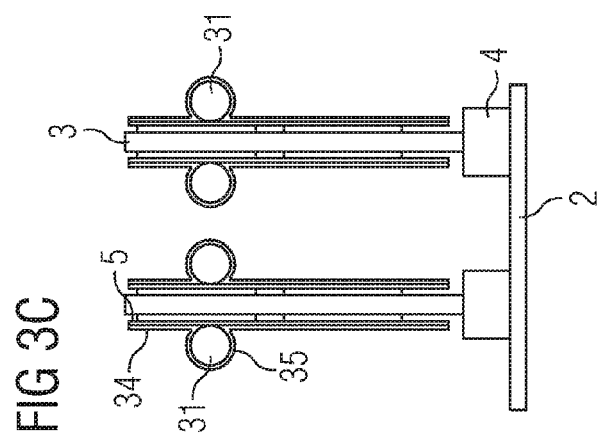
FIG 3A
FIG 3B
FIG 3C

HEAT TRANSFER SYSTEM FOR MEMORY MODULES

CROSS-REFERENCE TO RELATED APPLICATIONS

This application claims foreign priority benefits under 35 U.S.C. §119 to co-pending German patent application number DE 10 2007 045 733.4, filed Sep. 25, 2007. This related patent application is herein incorporated by reference in its entirety.

BACKGROUND OF THE INVENTION

1. Field of the Invention

The present invention relates to transfer of heat in electronic systems. In particular the invention relates to a memory module, a circuit board, a computer system and a heat transfer system.

2. Description of the Related Art

For computer systems, for example server, desktops or laptops an ongoing trend towards compact design with expanded memory capacity is recognized. This and the always increasing clock-rates of memory lead to increased waste heat of computer systems. Already the maximum amount of memory of a computer system is limited by thermal conditions in some applications. Therefore a need for concepts for cooling exists.

BRIEF DESCRIPTION OF THE DRAWINGS

The accompanying drawings are included to provide a further understanding of embodiments of the present invention and are incorporated in and constitute a part of this specification. The drawings illustrate the embodiments of the present invention and together with the description serve to explain the principles in a non-limiting manner. Other embodiments of the present invention and many of the intended advantages will be readily appreciated as they become better understood by reference to the following detailed description. The elements of the drawings are not necessarily to scale relative to each other. Like reference numerals designate corresponding similar parts.

FIG. 1 illustrates a schematic top view of a computer system and of a heat transfer system, according to one embodiment of the invention;

FIG. 2 illustrates a schematic side view of a computer system and of a heat transfer system, according to one embodiment of the invention;

FIGS. 3A, 3B, 3C show views of a memory module and heat transfer system, according to one embodiment of the invention;

DETAILED DESCRIPTION OF THE INVENTION

Figure 4A:
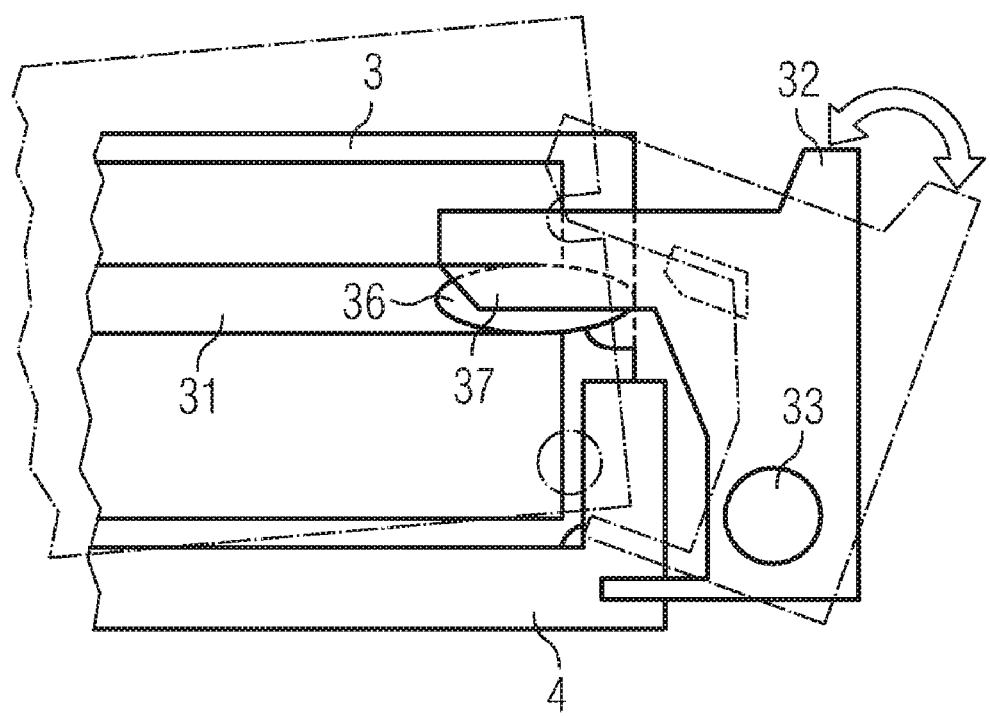
FIGS. 4A, 4B show detailed views of the heat transfer system, according to one embodiment of the invention.

In the following detailed description reference is made to the accompanying drawings, which form a part hereof, and in which is shown by way of illustration specific embodiments in which the invention may be practiced. In this regard, directional terminology, such as "top", "bottom", "front", "back", "leading", "trailing" etc., is used with reference to the orientation of the figures being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense and the scope of the present invention is defined by the appended claims.

It is to be understood that the features of the various examples described herein may be combined with each other, unless specifically noted otherwise.

FIG. 1 shows a schematic view of a computer system 1, according to one embodiment of the invention. As shown, the processor or computer system 1 has a circuit board 2 on which at least one memory module 3 having memory chips is arranged. Each memory module may comprise a circuit board having a first side and second side, where memory chips are arrangeable on either or both sides. In this example four memory modules 3 are attached to the circuit board. The memory modules 3 may be inserted into sockets of the circuit board 2 or they may be arranged on daughter boards. Further it is possible that the memory chips are arranged directly on the circuit board 2 where the individual memory chips may be assigned virtually to a memory module. This assignment may be reached for example by the organization of the memory.

The term processor or computer system as it is used herein has various meanings. On one hand are the classical computers encompassed for example server, desktops or laptops on the other hand memory sub-subsystems, plug-in cards or game consoles are encompassed as well. Multimedia devices as for example multimedia computer, video recorder, television sets or beamer are encompassed by the term processor or computer system as well. Furthermore network devices as for example router, switches and wireless LAN components are covered by the term processor or computer system. The computer system 1 as shown schematically in FIG. 1 can comprise additional not shown components as for example one or more CPUs, a chipset and one or more slots for expansion cards.

As shown, a heat transfer system 10 is connected to the computer system 1. The heat transfer system 10 may comprise several module heat conductors 11 each of which being in thermal communication with the memory module 3. One end of the module heat conductor 11 may be thermally connected with a removable coupling element 12. The coupling element 12 may be movably designed so that the memory module 3 together with the module heat conductor 11 can be removed from the circuit board 2 (in the case of a socketed memory module).

The coupling elements 12 may connect the module heat conductors 11 with a central heat conductor 13. The central heat conductor 13 may be attached to the circuit board 2 or to a not shown housing for example. A cooling device 14 may be connected to one end of the central heat conductor 13. The cooling device 14 may be arranged as depicted here outside of the circuit board 2 or the housing of the computer system respectively. The cooling device 13 can also be arranged on the circuit board 2 or inside of computer system 1.

The heat transfer system 10 conveys heat from the memory module 3 to the cooling device 14 so that the memory module 3 works in a defined temperature range. For example, the heat may firstly be carried from the memory module 3 to the module heat conductor 11. For that purpose the module heat conductor 11 may be attached to a heat spreader of the memory module 3 for example. The thermal coupling may be improved by auxiliary material as for example thermally conductive paste. The heat may then be carried on through the module heat conductor 11 towards the coupling element 12 and there conveyed to the central heat conductor 13. The heat may be conveyed in the central heat conductor 13 to the cooling device 14 where the heat is brought out of the system. A cooling device 14 may comprise cooling fins which may be cooled by for example air or water. The module heat conductor 11 and the central heat conductor 13 may for instance be heat pipes, comprise circulating water or comprise a material with good thermal connectivity such as graphite or copper.

FIG. 2 shows schematically a further example of a computer system 21 in a side view, according to one embodiment of the invention. As shown, the computer system 21 may comprise several circuit boards 2; Illustratively, two circuit boards are depicted. Every circuit board 2 may comprise several memory modules 3 each of which is inserted into a socket 4 of the circuit board 2. The heat transfer system 10 may comprise, as shown in the example of FIG. 1, module heat conductors 11 which are connected to the central heat conductor 13 via coupling elements 12. The central heat conductor 13 may be connected to the cooling device 14. For each circuit board 2 a central heat conductor 13 may be provided in the computer system 21. Hence, several central heat conductors 13 may be connected to the cooling device 14. This may be the case in a server comprising multiple boards or modules.

FIGS. 3A-3C depict a part of a further example of a heat transfer system 30. In contrast to the heat transfer system shown in FIGS. 1 and 2 the heat transfer system 30 comprises module heat conductors 31 on both sides of the memory modules 3.

FIG. 3A shows a top view of a section of circuit board 2 on which multiple memory modules 3 are arranged, according to one embodiment of the invention. To each of the memory modules 3 two module heat conductors 31 may be attached, one on each side of the memory modules 3. Depending on conditions of the system as for example available space, heat distribution or airflow it may be possible to mix the memory modules 3 i.e. use in one system modules equipped with only one module heat conductor and memory modules comprising two module heat conductors.

In the following the configuration of the heat transfer system 30 is described in detail. The description starts with the attachment of the module heat conductor 31 and continues with a thermal coupling of the module heat conductor 31 with the central heat conductor 33 via removable coupling elements 32. The central heat conductor 33 may be connected to a cooling device which is not depicted.

With regard to FIG. 3C the attachment of the module heat conductor 31 to the memory modules 3 is now described, according to one embodiment of the invention. In this example a heat spreader 5 is arranged at both sides of the memory module 3. These heat spreaders 5 may be thin metal sheets for example made of aluminum which may cover the entire surface of the memory module 3 and are attached using glue or clip elements. Attached to the heat spreader 5 may be a heat guiding plate 34 which comprises a recess 35 for accommodation of the module heat conductor 31. The recess 35 may be bent to be adapted to the circumference of the module heat conductor 31. A thermal interface material as for example thermally conductive paste may be arranged between the heat spreader 5 and the heat guiding plate 34 in order to improve the heat transfer. The heat guiding plate 34 may be glued onto the heat spreader 5 or may be attached to it with one or more holding clips. The heat spreader 5 and the heat guiding plate 34 may be a one piece arrangement.

With regard to FIGS. 3A and 3B the coupling element 32 is explained, according to one embodiment of the invention. As shown, the coupling element 32 or coupling apparatus secures on one hand the memory module 3 mechanically and provides on the other hand thermal coupling of the module heat conductor 31 with the central heat conductor 33. The coupling element 32 may be pivot-mounted at the central heat conductor 33 so that the coupling element 32 is in thermal and mechanical contact with the memory module 3 in a closed position and is disconnected from the memory module 3 in an open position so that the memory module 3 can be removed out of the socket 4. In the closed position the coupling element 32 may contact a contact surface 36 of the module heat conductor 31.

Figure 4B:
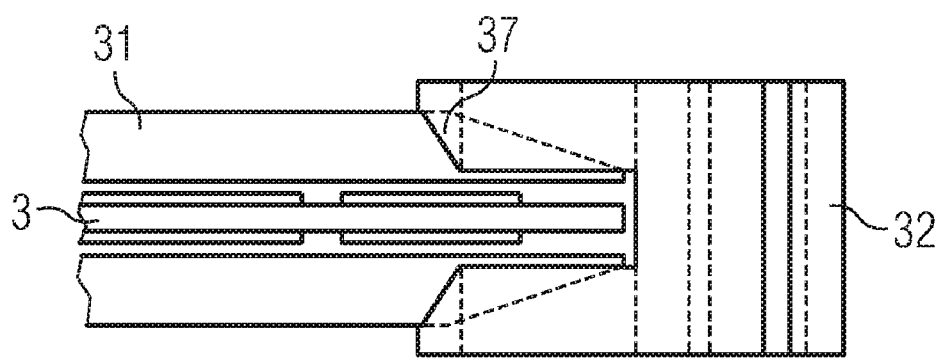

With respect to FIGS. 4A and 4B the coupling element 32 is described in detail, according to one embodiment of the invention. To begin with, the mechanical fixation of the memory module 3 by means of the coupling element 32 is described. FIG. 4A shows the coupling element 32 in a closed position and in an open position in dashed lines. Projections of the coupling element 32 may interlock into recesses of the memory module 3 so that the memory module 3 is held reliably in the memory socket 4 in the closed position. During the releasing movement i.e. from closed into the open state the projections may lift the memory module so that removal of the memory module 3 is eased.

Besides the mechanical coupling the coupling element 32 may couple the memory module 3 thermally with the central heat conductor 33. For that, the module heat conductor 31 may comprise a chamfered contact surface 36 which is directed towards the coupling element 32 when the memory module 3 is inserted. The coupling element 32 may comprise a chamfered contact surface 37 which contacts the contact surface 36 of the module heat conductor 31 in the closed state. Thermally conductive paste or similar material may be provided on one or both contact surfaces 36, 37 respectively to enhance heat transfer.

As an alternative to contact the frontal contact surface 36 the coupling element 32 may be shaped in such a way that part of the peripheral surface of the module heat conductor 31 is contacted. The coupling element 32 may contact both the peripheral surface of the module heat conductor 31 and the frontal contact surface 36 whether the frontal contact surface 36 is chamfered or not.

The material of the coupling element is selected such that good heat transfer from the contact surface 36 of the module heat conductor 31 to the central heat conductor 33 takes place. For example aluminum, copper or graphite may be chosen. The module heat conductor 31 and/or the central heat conductor 33 may for example be designed as heat pipes.

This embodiment shows the coupling device or in other words the removable coupling element 32 made out of one piece which enables both the mechanical and the thermal coupling. The coupling element may be designed in two pieces wherein one part does the mechanical coupling and the second part does the thermal coupling. Both parts may be connected so that for example upon actuation of the mechanical part the thermal coupling is established as well.

Figure 5A:
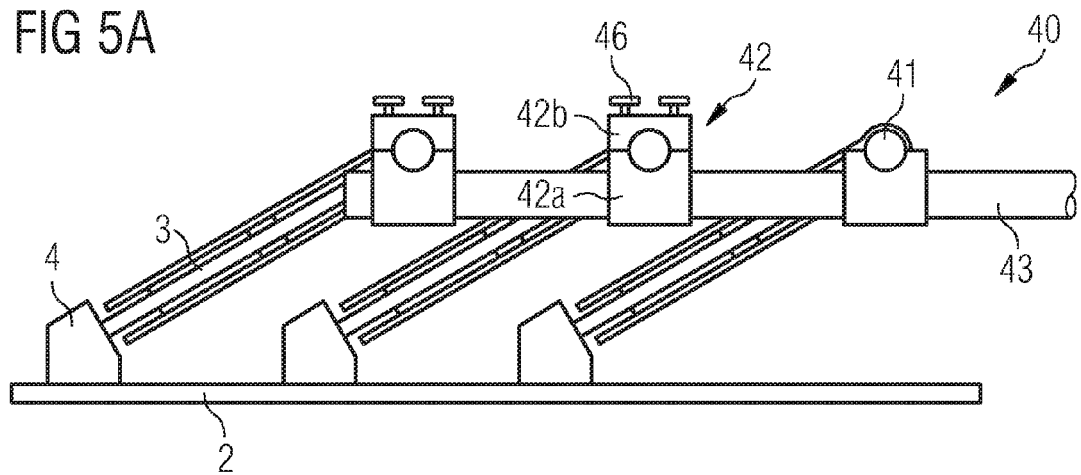
FIGS. 5A, 5B, 5C show a use of a memory module and a heat transfer system, according to one embodiment of the invention.

FIG. 5A shows a heat transfer system 40, according to another embodiment of the invention. The heat transfer system 40 cools memory modules 3 which are inserted into memory sockets 4 which in turn are arranged on a circuit board 2. In this embodiment the inserted memory modules 3 are not arranged perpendicular with regard to the circuit board 2 but under a smaller angle. Server systems use this arrangement often. The heat transfer system 40 may comprise module heat conductors 41 attached to the memory modules 3, a central heat conductor 43 and removable coupling elements 42 which connect the module heat conductor 41 with the central heat conductor 43. The central heat conductor 43 may be connected to a cooling device (not shown).

Figure 5B:
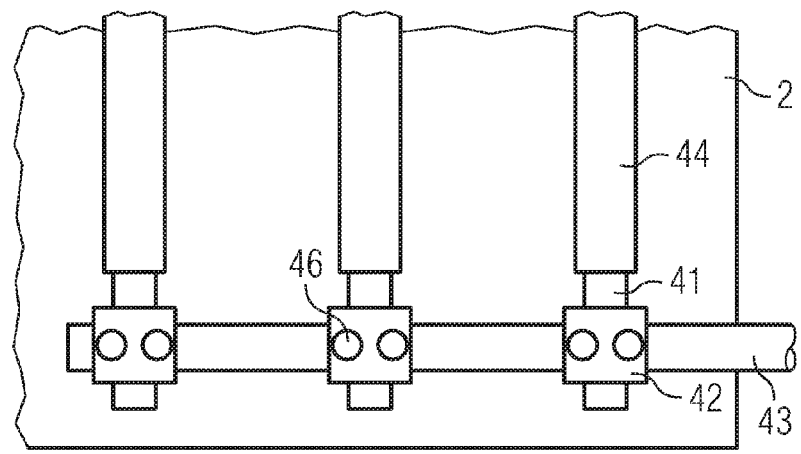
Figure 5C:
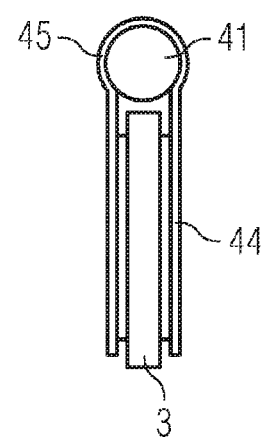

FIG. 5C shows the attachment of the module heat conductor 41 to the memory module 3, according to one embodiment of the invention. A heat guiding plate 44 transfers the heat from the sides of the memory module 3 towards the module heat conductor 41.

As it is seen in FIG. 5B, the module heat conductor 41 extends over the heat guiding plate 44 in longitudinal direction of the memory module so that the extending end of the module heat conductor 41 can be connected with a coupling element 42 in a removable manner, according to one embodiment of the invention.

With reference to FIG. 5A, the coupling element 42 may comprise a first part 42a which may be permanently connected to the central heat conductor 43 and a removable second part 42b. The second part 42b can be fastened to the first part 42a by for example a clip, bayonet coupling, a bolt connection or as shown here with screws 46. The first part 42a may have a recess or a bore hole so that it can be put on the central heat conductor 43. Thermally conductive paste may be provided in the bore hole to increase heat transfer between the coupling element 42 and the central heat conductor 43. The first part 42a may have a recess in form of a half cylinder in its contact surface to the second part 42b. The longitudinal axis of the recess may be orientated approximately at a right angle with regard to the longitudinal axis of the bore hole for the central heat conductor. The recess may be provided in such a form that the module heat conductor 41 has contact as extensive as possible to the first part 42a. A corresponding recess is in the second part 42b provided so that the whole circumference of the module heat conductor 41 is enclosed by the two parts of the coupling element 42 in an assembled state of the coupling element 42.

In the following a change of a memory module 3 is described. To remove the inserted memory module 3 the screws 46 of the corresponding coupling element 42 may be loosened thereupon the second part 42b is removed whereupon the memory module 3 can be removed from the socket 4. The new memory module 3 may be inserted into the socket 4, in doing so the module heat conductor 41 is moved into the recess of the first part 42a. Once the memory module 3 is inserted tightly into the socket 4, the second part 42b is attached to the first part 42a with use of the screws 46 so that the memory module 3 is now firmly connected to the central heat conductor 43.

In the embodiments described above reference is made to memory modules. The invention is however not restricted to memory modules. In fact the invention can be used with other pluggable modules or cards as for example processor or graphic cards, cards for acceleration of physical computations or pluggable power modules. In a broader sense the invention can be used with all types of pluggable cards which benefit from heat dissipation.

What is claimed is:

1. A memory module, comprising:
  a circuit board with a first and a second side comprising:
    memory chips, which are arranged at least on the first side, and
    a first module heat pipe having at least a portion that extends longitudinally on the first side, wherein the first module heat pipe forms a first contact surface;
    a second module heat pipe with a second contact surface is arranged on the second side; and
    a heat transfer system comprising:
      a first coupling member configured to contact the first contact surface, and
      a central heat conductor, wherein the first coupling member is configured to thermally couple the first module heat pipe and the central heat conductor, wherein a coupling element comprising the first coupling member is configured to contact both the first and second contact surfaces such that the central heat conductor is thermally coupled to both the first and second module heat pipes.

2. The memory module of claim 1, wherein the first module heat pipe is arranged in a recess of a heat guiding plate which covers one side of the circuit board at least partially.

3. The memory module of claim 1, wherein the coupling element is pivot-mounted at the central heat conductor.

4. The memory module of claim 1, wherein at least a portion of the central heat conductor transfers heat away from the memory chips in a longitudinal direction which is parallel with the first side of the circuit board.

5. A circuit board, comprising:
  at least one memory socket;
  a coupling device configured to fasten a memory module in the memory socket; and
  a heat transfer system comprising a central heat conductor and the coupling device, wherein at least part of the coupling device is thermally conductive and in thermal communication with the central heat conductor, and wherein the coupling device comprises a contact surface configured for thermal communication with the memory module, wherein the coupling device is pivot-mounted on the central heat conductor.

6. The circuit board of claim 5, wherein the coupling device comprises two contact surfaces.

7. The circuit board of claim 5, wherein the coupling device has a clip comprising metal or graphite.

8. The circuit board of claim 5, wherein the coupling device comprises a clip configured for mechanical coupling and a heat transfer device configured for thermal coupling of the memory module.

9. The circuit board of claim 5, comprising a cooling device, which is connected to the central heat conductor.

10. The circuit board of claim 5, comprising several memory sockets and several coupling devices, wherein the coupling devices are in thermal communication with the central heat conductor.

11. The circuit board of claim 5, wherein the central heat conductor is a heat pipe.

12. The circuit board of claim 5, wherein the coupling device is configured to thermally couple a module heat conductor to the central heat conductor, wherein the module heat conductor is attachable to the memory module.

13. A heat transfer system for a memory system, comprising:
  at least one module heat conductor which is attachable to a memory module;
  a central heat conductor;
  coupling elements, which couple the module heat conductor and the central heat conductor thermally and are pivot-mounted at the central heat conductor; and
  a cooling device, which is coupled to the central heat conductor.

14. The heat transfer system of claim 13, wherein at least one of the module heat conductor and the central heat conductor is a heat pipe.

15. The heat transfer system of claim 13, wherein the module heat conductor comprises a heat guiding plate and wherein the central heat conductor comprises a heat pipe.

16. The heat transfer system of claim 13, wherein the coupling elements couple the memory module mechanically.

17. The heat transfer system of claim 13, wherein the central heat conductor is attachable to a circuit board on which a socket for the memory module is arranged.

18. The heat transfer system of claim 13, wherein the coupling elements are non-removably connected with the central heat conductor.

19. A computer system, comprising:
   at least one circuit board, comprising:
      at least one memory socket;
      a coupling device configured to fasten a memory module in the memory socket; and
      a heat transfer system comprising a central heat conductor and the coupling device, wherein at least part of the coupling device is thermally conductive and in thermal communication with the central heat conductor, and wherein the coupling device comprises a contact surface configured for thermal communication with the memory module, wherein the coupling device is pivot-mounted at the central heat conductor; and
   at least one memory module fastened to the at least one memory socket, comprising:
      a circuit board with a first and a second side;
      memory chips, which are arranged at least on the first side; and
      a longitudinally extending module heat pipe, which is arranged on the first side, wherein the module heat pipe forms a heat transfer system contact surface configured to contact the heat transfer system.

20. A computer system, comprising:
   a circuit board comprising at least one memory socket for a memory module;
   at least one memory module; and
   a heat transfer system, comprising:
      at least one module heat conductor which is attachable to the at least one memory module;
      a central heat conductor;
      removable coupling elements, which thermally couple the module heat conductor and the central heat conductor and are pivot-mounted at the central heat conductor; and
      a cooling device, which is coupled to the central heat conductor.

* * * * *